United States Patent
Kamiya et al.

(10) Patent No.: US 10,985,413 B2
(45) Date of Patent: *Apr. 20, 2021

(54) METHOD FOR TESTING ALL SOLID STATE BATTERY, METHOD FOR PRODUCING ALL SOLID STATE BATTERY, AND METHOD FOR PRODUCING BATTERY PACK

(71) Applicant: TOYOTA JIDOSHA KABUSHIKI KAISHA, Toyota (JP)

(72) Inventors: Masato Kamiya, Toyota (JP); Katsuhiko Nagaya, Toyota (JP); Norihiro Yamada, Anjo (JP); Shinobu Okayama, Miyoshi (JP); Takayuki Hojo, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 11 days.

This patent is subject to a terminal disclaimer.

(21) Appl. No.: 16/287,086

(22) Filed: Feb. 27, 2019

(65) Prior Publication Data
US 2019/0280350 A1    Sep. 12, 2019

(30) Foreign Application Priority Data

Mar. 6, 2018 (JP) ............................. JP2018-039811
Nov. 8, 2018 (JP) ............................. JP2018-210363

(51) Int. Cl.
*H01M 10/48* (2006.01)
*G01R 31/385* (2019.01)
(Continued)

(52) U.S. Cl.
CPC ........ *H01M 10/48* (2013.01); *G01R 31/3865* (2019.01); *H01M 10/0413* (2013.01); *H01M 10/4285* (2013.01)

(58) Field of Classification Search
CPC ............. H01M 10/48; H01M 10/0413; H01M 10/4285; H01M 4/505; H01M 4/525;
(Continued)

(56) References Cited

U.S. PATENT DOCUMENTS

| | | |
|---|---|---|
| 2015/0048838 A1* | 2/2015 | Ose ...................... G01R 31/382 324/430 |
| 2016/0375790 A1 | 12/2016 | Komiyama |
| 2017/0207440 A1 | 7/2017 | Hama et al. |

FOREIGN PATENT DOCUMENTS

| | | |
|---|---|---|
| CN | 104204829 A | 12/2014 |
| CN | 105229483 A | 1/2016 |

(Continued)

OTHER PUBLICATIONS

Notice of Allowance dated May 20, 2020 in U.S. Appl. No. 16/386,435.

*Primary Examiner* — Melissa J Koval
*Assistant Examiner* — Trung Q Nguyen
(74) *Attorney, Agent, or Firm* — Sughrue Mion, PLLC

(57) ABSTRACT

A method for testing an all solid state battery with which the presence of short circuit or the presence of defect causing short circuit can be detected with high accuracy by a method in which a voltage is applied to a battery and the current value thereof is measured. The method includes the steps of: a resistance increasing step of increasing resistance of an all solid state battery to $3.2 \times 10^5$ Ω·cm2 or more; a voltage applying step of applying voltage to an all solid state battery of which the resistance is increased; and a judging step of judging acceptability of the all solid state battery based on a current value measured in the voltage applying step.

9 Claims, 3 Drawing Sheets

(51) Int. Cl.
*H01M 10/42* (2006.01)
*H01M 10/04* (2006.01)

(58) Field of Classification Search
CPC ............ G01R 31/3865; G01R 31/3644; G01R 31/006; G01R 33/093; G01R 31/392
USPC ...... 324/200, 207.11–207.19, 219, 220, 233, 324/234, 239, 241, 425–437, 443–447, 324/500, 515, 529, 530, 750.06
See application file for complete search history.

(56) References Cited

FOREIGN PATENT DOCUMENTS

| | | |
|---|---|---|
| CN | 106291368 A | 1/2017 |
| CN | 106981664 A | 7/2017 |
| JP | 2001-110458 A | 4/2001 |
| JP | 2009-289757 A | 12/2009 |
| JP | 2015008073 A | 1/2015 |
| JP | 2016-18704 A | 2/2016 |
| JP | 2016207540 A | 12/2016 |
| KR | 10-2015-0050481 A | 5/2015 |
| WO | 2014159323 A1 | 10/2014 |

\* cited by examiner

METHOD FOR TESTING ALL SOLID STATE BATTERY, METHOD FOR PRODUCING ALL SOLID STATE BATTERY, AND METHOD FOR PRODUCING BATTERY PACK

TECHNICAL FIELD

The present disclosure relates to a method for testing an all solid state battery.

BACKGROUND ART

An all solid state battery is a battery including a solid electrolyte layer between a cathode active material layer and an anode active material layer, and one of the advantages thereof is that the simplification of a safety device may be more easily achieved compared to a liquid-based battery including a liquid electrolyte containing a flammable organic solvent.

Meanwhile, Patent Literature 1 discloses a method for detecting short circuit of a battery by applying voltage to a non-injected battery (battery before injecting a liquid electrolyte) provided with a cell comprising a cathode plate, an anode plate, and a separator, although the technique is not related to an all solid state battery.

CITATION LIST

Patent Literatures

Patent Literature 1: Japanese Patent Application Laid-Open (JP-A) No. 2001-110458

SUMMARY OF DISCLOSURE

Technical Problem

It is preferable to detect the presence of short circuit (including minute short circuit) or presence of a defect causing short circuit (such as a foreign substance) when an all solid state battery is produced. For example, in Patent Literature 1, a voltage is applied to a battery comprising a cathode plate, an anode plate, and a separator but not comprising a liquid electrolyte, and the current value thereof is measured to detect short circuit. However, it is difficult to simply apply this kind of detecting method to an all solid state battery due to characteristics of a solid electrolyte.

The present disclosure has been made in view of the above circumstances, and a main object thereof is to provide a method for testing an all solid state battery with which the presence of short circuit or the presence of defect causing short circuit can be detected with high accuracy by a comparatively simple method in which a voltage is applied to a battery and the current value thereof is measured.

Solution to Problem

In order to achieve the object, the present disclosure provides a method for testing an all solid state battery, the method comprising steps of: a resistance increasing step of increasing resistance of an all solid state battery to $3.2*10^5$ $\Omega \cdot cm^2$ or more; a voltage applying step of applying voltage to an all solid state battery of which the resistance is increased; and a judging step of judging acceptability of the all solid state battery based on a current value measured in the voltage applying step.

According to the present disclosure, the all solid state battery with the resistance increased to the specific value is used as a target of testing, and thus the presence of short circuit or the presence of a defect causing short circuit can be detected with high accuracy by a comparatively simple method in which a voltage is applied to a battery and the current value thereof is measured.

In the disclosure, the resistance of the all solid state battery may be increased by a freezing treatment in the resistance increasing step.

In the disclosure, the freezing treatment may be a treatment of setting a temperature of the all solid state battery to be $-90°$ C. or less.

In the disclosure, the freezing treatment may be a treatment of setting a temperature of the all solid state battery to be $-140°$ C. or less.

The present disclosure also provides a method for testing an all solid state battery, the method comprising steps of: a resistance increasing step of increasing resistance of an all solid state battery by a freezing treatment; a voltage applying step of applying voltage to an all solid state battery of which resistance is increased; and a judging step of judging acceptability of the all solid state battery based on a current value measured in the voltage applying step.

According to the present disclosure, the all solid state battery with the resistance increased by the freezing treatment is used as a target of testing, and thus the presence of short circuit or the presence of a defect causing short circuit can be detected with high accuracy by a comparatively simple method in which a voltage is applied to a battery and the current value thereof is measured.

In the disclosure, the resistance of the all solid state battery may be increased by a treatment of reducing a confining pressure of the all solid state battery in the resistance increasing step.

In the disclosure, the all solid state battery is a battery containing a sulfide solid electrolyte; the resistance of the all solid state battery of which voltage is adjusted to 1.5 V or more and 3.5 V or less, may be increased in the resistance increasing step; and voltage may be applied twice or more in the voltage applying step.

The present disclosure also provides a method for testing an all solid state battery, the method comprising steps of: a preparing step of preparing an all solid state battery; and a testing step of testing the all solid state battery using the above described method for testing an all solid state battery.

According to the present disclosure, an all solid state battery is tested using the above described method and thus an all solid state battery with higher safety can be obtained.

The present disclosure also provides a method for producing a battery pack, the method comprising steps of: a preparing step of preparing an all solid state battery; a testing step of testing the all solid state battery using the above described method for testing an all solid state battery; and an assembling step of assembling a battery pack using a plurality of the all solid state battery judged acceptable in the testing step.

According to the present disclosure, the all solid state battery judged acceptable in the testing step is used, and thus a battery pack with higher safety can be obtained.

Advantageous Effects of Disclosure

The method for testing an all solid state battery of the present disclosure exhibits effects capable of detecting the presence of short circuit or the presence of defect causing short circuit can be detected with high accuracy by a comparatively simple method in which a voltage is applied to a battery and the current value thereof is measured.

DESCRIPTION OF EMBODIMENTS

The method for testing an all solid state battery, the method for producing an all solid state battery, and the method for producing a battery pack of the present disclosure are hereinafter explained in details.

A. Method for Testing All Solid State Battery

Figure 1:
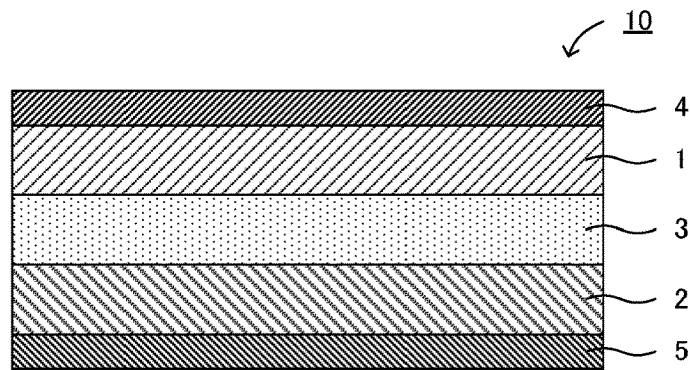
FIG. 1 is a schematic cross-sectional view illustrating an example of the all solid state battery in the present disclosure.

FIG. 1 is a schematic cross-sectional view illustrating an example of the all solid state battery in the present disclosure. All solid state battery 10 illustrated in FIG. 1 comprises cathode active material layer 1, anode active material layer 2, and solid electrolyte layer 3 formed between cathode active material layer 1 and anode active material layer 2. All solid state battery 10 further comprises cathode current collector 4 for collecting currents of cathode active material layer 1, and anode current collector 5 for collecting currents of anode active material layer 2.

Figure 2:
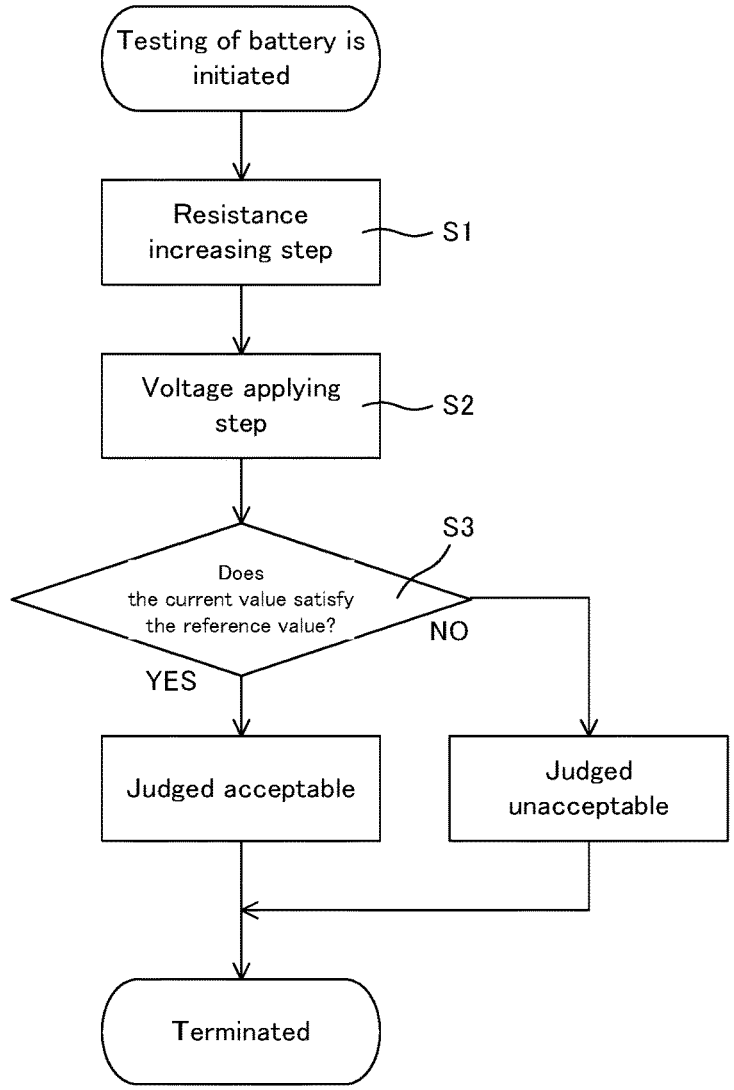
FIG. 2 is a flow chart explaining an example of the method for testing an all solid state battery of the present disclosure.

FIG. 2 is a flow chart explaining an example of the method for testing an all solid state battery of the present disclosure. When the method for testing an all solid state battery of the present disclosure is initiated, first, the resistance of the all solid state battery is increased (resistance increasing step, S1). The resistance of the all solid state battery is increased by a treatment such as a freezing treatment. Next, voltage is applied to the battery of which resistance is increased (voltage applying step, S2). When the resistance of the all solid state battery is high enough, a high voltage such as approximately 1000 V may be applied. Next, the currency caused when voltage is applied is measured, and the acceptability of the all solid state battery is judged based on the current value measured (judging step, S3). For example, the measured current value $I_A$ and current value $I_B$, a reference for judging the acceptability, are used and if the ratio of $I_A$ to $I_B$ ($I_A/I_B$) is less than the reference value, it is judged acceptable, and if the ratio is the reference value or more, it is judged unacceptable. Thereby, the test is terminated.

According to the present disclosure, the all solid state battery with increased resistance is used as a target for testing, and thus the presence of short circuit or the presence of a defect causing short circuit can be detected with high accuracy by a comparatively simple method in which a voltage is applied to a battery and the current value thereof is measured. In particular, in the present disclosure, the presence of short circuit in a solid electrolyte layer (internal short circuit) can be detected with high accuracy. Also, the short circuit in the present disclosure includes a minute short circuit. The minute short circuit is referred to a slight short circuit where charge and discharge are possible although short circuit itself occurs. For example, the minute short circuit is easily caused when the insulating property of the solid electrolyte layer is low. Meanwhile, examples of the defect causing short circuit may include a foreign substance. For example, when a foreign substance is present inside or in the vicinity of the solid electrolyte layer, a crack is easily generated in the solid electrolyte layer, and short circuit easily occurs as the result.

As described above, in Patent Literature 1, a voltage is applied to a battery comprising a cathode plate, an anode plate, and a separator but not comprising a liquid electrolyte, and the current value thereof is measured to detect short circuit. However, it is difficult to simply apply this kind of detecting method to an all solid state battery due to characteristics of a solid electrolyte. The reasons therefor are as follows. Ions are not conducted between cathode and anode in a battery comprising a cathode, an anode, and a separator, but not comprising a liquid electrolyte. In other words, it is in a state not functioning as a battery, and thus the presence of short circuit can be easily detected by applying voltage between the cathode and the anode to measure the current value. On the other hand, the solid electrolyte layer in the all solid state battery has ion conductivity as well as insulating properties. In other words, the battery comprising a solid electrolyte layer is in a state functioning as a battery; thus, when voltage is applied between the cathode and anode, the charge of the all solid state battery is caused, and non-destructive detection of the presence of short circuit is difficult even by mearing the current value. In this manner, it is difficult to simply apply the detecting method for a liquid-based battery to an all solid state battery.

To solve the problem, in the present disclosure, the resistance of the all solid state battery is increased by a treatment such as a freezing treatment. Thereby, the reaction occurs inside the battery may be inhibited. The presence of short circuit or the presence of defect causing short circuit can be detected with high accuracy by applying voltage between the cathode and anode of the battery that is in such a high resistance state to measure the current value.

1. Resistance Increasing Step

The resistance increasing step in the present disclosure is a step of increasing the resistance of an all solid state battery. In this step, the resistance of the all solid state battery may be, for example, increased to $1*10^5$ $\Omega \cdot cm^2$ or more, may be increased to $3.2*10^5$ $\Omega \cdot cm^2$ or more, may be increased to $1*10^6$ $\Omega \cdot cm^2$ or more, may be increased to $1*10^7$ $\Omega \cdot cm^2$ or more, may be increased to $1*10^8$ $\Omega \cdot cm^2$ or more, and may be increased to $3.2*10^8$ $\Omega \cdot cm^2$ or more. Incidentally, the resistance of the all solid battery is inversely proportional to the area; thus, in the present disclosure, it is specified as the resistance per unit area ($\Omega \cdot cm^2$). Also, the resistance of the all solid state battery may be determined by a method described in Examples later.

Also, the extent of increasing the resistance of the all solid battery varies with the purpose of a test. The higher the difficulty of the test is, the more the resistance of the all solid state battery is preferably increased. Examples of the purpose of the test may include short circuit detection, minute short circuit detection, and foreign substance detection. Also, examples of the foreign substance detection may include detection of a foreign substance that penetrates a solid electrolyte layer, detection of a foreign substance that does not penetrate a solid electrolyte layer, detection of a foreign substance included in a solid electrolyte layer, and detection of a foreign substance included in between a solid electrolyte layer and an electrode active material layer (a cathode active material layer or an anode active material layer).

In the present disclosure, the resistance of the all solid state battery is usually increased by a resistance increasing treatment. There are no particular limitations on the resistance increasing treatment, but is preferably a treatment with which the resistance of the all solid state battery can be increased to the extent not functioning as a battery. Also, the resistance increasing treatment is preferably a treatment of temporarily increasing the resistance of the all solid state battery. It means that it is preferably a treatment with which the resistance increased after the later described voltage applying step can be reduced.

An example of the resistance increasing treatment is a freezing treatment. In the freezing treatment, the temperature of the all solid state battery is lowered to inhibit or terminate the reactions that occur inside the battery as a whole, and thereby the resistance of the all solid state battery is increased. Incidentally, for example, when the freezing treatment is conducted to a liquid electrolyte, the battery is easily damaged since a volume change during freezing is large. On the other hand, one of the advantages of the all solid state battery is that the battery is not easily damaged since the volume change thereof during freezing is small.

In the present disclosure, by the freezing treatment, the temperature of the all solid state battery may be, for example, set to −45° C. or less, may be set to −90° C. or less, may be set to −100° C. or less, may be set to −120° C. or less, may be set to −135° C. or less, and may be set to −140° C. or less. There are no particular limitations on the method for freezing and examples thereof may include a method of bringing the all solid state battery into contact with a refrigerant. Examples of the refrigerant may include liquid helium, liquid nitrogen, liquid oxygen, and dry ice. Also, as the refrigerant, a general freezing mixture may be used.

An additional example of the resistance increasing treatment may include a treatment of reducing the confining pressure of the all solid state battery. A confining pressure is usually applied to the all solid state battery to reduce the battery resistance. The resistance of the all solid state battery may be increased by reducing the confining pressure. Incidentally, in this treatment, the confining pressure may be 0. Also, this treatment is preferably used as an auxiliary treatment of the freezing treatment.

There are no particular limitations on the voltage of the all solid state battery just before conducting the resistance increasing treatment. A charging treatment may and may not be conducted to the all solid state battery before conducting the resistance increasing treatment.

2. Voltage Applying Step

The voltage applying step in the present disclosure is a step of applying voltage to the all solid state battery of which resistance is increased. There are no particular limitations on the method for applying voltage to the all solid state battery, and examples thereof may include a method of applying voltage by connecting an insulation resistance measurement device to the cathode and anode terminals.

There are no particular limitations on the value of the voltage to be applied; for example, the voltage is 1 V or more, may be 2 V or more, may be 100 V or more, may be 500 V or more, and may be 1000 V or more. The current value to be measured becomes larger as the value of the voltage becomes larger. Meanwhile, there are no particular limitations on the upper limit of the voltage to be applied; however, if an extremely high voltage is applied, there is a possibility of damaging the all solid state battery. For example, when the resistance of the all solid state battery at the time of the measurement is high enough, the current value becomes small even when the applying voltage is set high; thus, the all solid state battery is not easily damaged. On the other hand, when the resistance of the all solid state battery at the time of the measurement is low, current value becomes large if the applying voltage is set high; thus, the all solid state battery is easily damaged. The value of the applying voltage is, for example, the value at which the current value that flows in the all solid state battery (particularly the all solid state battery judged acceptable) becomes 5 mA or less, and may be the value at which the current value becomes 3.2 mA or less. Also, the time of applying the voltage is, for example, 0.1 second or more, may be 0.5 seconds or more. Meanwhile, the time of applying the voltage is, for example, 10 seconds or less, and may be 5 seconds or less.

There are no particular limitations on the number of times of applying the voltage to the all solid state battery. The number of times of applying the voltage may be once, may be twice or more, and may be three times or more. The number of data to be obtained increases as the number of times of applying the voltage increases, and thereby the accuracy of judging acceptability basically improves.

3. Judging Step

The judging step in the present disclosure is a step of judging the acceptability of the all solid state battery based on the current value measured in the voltage applying step.

The reference for judging the acceptability may be appropriately set in accordance with the purpose of a test. For example, when the current value measured is regarded as $I_A$ and the current value as a reference for judging the acceptability is regarded as $I_B$, when the ratio of $I_A$ to $I_B$ ($I_A/I_B$) is less than the reference value, it can be judged acceptable, and when the ratio is the reference value or more, it can be judged unacceptable. There are no particular limitations on the reference value of $I_A/I_B$; for example, it may be 1.5 or more, and it may be 2 or more.

Also, as described above, the number of data to be obtained increases as the number of times of applying the voltage increases, and thereby the accuracy of judging acceptability basically improves. Meanwhile, when a voltage is applied a plurality of times to the all solid state battery containing a sulfide solid electrolyte, the accuracy of judging the acceptability may be degraded in some cases inversely. In specific, when a voltage is applied a plurality of times to the all solid state battery containing a sulfide solid electrolyte, the current value $I_A$ to be measured may be increased in some cases even if the battery is a quality product not having short circuit or a defect. When the current value $I_A$ increases, the value of $I_A/I_B$ also increases; thus, it is difficult to judge the acceptability. The reason for the increase in the current value $I_A$ by applying a voltage is not completely clear; however, possibilities are because the sulfide solid electrolyte is deteriorated or deformed, and because a conductive sulfide (such as CuS) is generated when a voltage is applied for the first time.

To solve the problem, the increase in the current value $I_A$ (increase in the value of $I_A/I_B$) can be suppressed by setting the voltage of the battery to be 1.5 V or more and 3.5 V or less even when the voltage is applied a plurality of times. Also, the accuracy of judging the acceptability further improves since the number of data to be obtained increases. In this manner, when the all solid state battery is a battery containing a sulfide solid electrolyte, it is preferable that the resistance of the all solid state battery of which voltage is adjusted to be 1.5 V or more and 3.5 V or less, is increased in the resistance increasing step, and it is preferable that the voltage is applied twice or more in the voltage applying step.

The voltage of the battery may be 1.7 V or more, and may be 1.9 V or more. Meanwhile, the voltage of the battery may be 3.3 V or less, and may be 3.1 V or less. The voltage of the battery may be adjusted by a charging treatment for example.

4. All Solid State Battery

There are no particular limitations on the all solid state battery in the present disclosure if it is a battery including a solid electrolyte layer; however, it is preferably a battery using metal ions as the charge carrier. In particular, the all solid state battery in the present disclosure is preferably an all solid lithium ion battery. Also, the all solid state battery may be a primary battery and may be a secondary battery, but preferably a secondary battery among them, so as to be repeatedly charged and discharged, and useful as a car-mounted battery, for example. Also, the all solid state battery may be a battery comprising one power generating element including a cathode active material layer, a solid electrolyte layer, and an anode active material layer, and may be a battery comprising a plurality of the power generating element. In the latter case, the all solid state battery may be a battery in which a plurality of the power generating element are connected in parallel, and may be a battery in which a plurality of the power generating element are connected in series. Also, adjacent power generating elements may share current collectors.

(1) Solid Electrolyte Layer

The solid electrolyte layer is a layer containing a solid electrolyte, and may further contain a binder. Examples of the solid electrolyte may include an inorganic solid electrolyte. Examples of the inorganic solid electrolyte may include a sulfide solid electrolyte, an oxide solid electrolyte, a nitride solid electrolyte, and a halide solid electrolyte. Also, the inorganic solid electrolyte preferably has Li ion conductivity for example.

Examples of the sulfide solid electrolyte may include a solid electrolyte containing a Li element, an X element (X is at least one kind of P, Si, Ge, Sn, B, Al, Ga, and In), and a S element. Also, the sulfide solid electrolyte may further contain a halogen element. Also, examples of the oxide solid electrolyte may include a solid electrolyte containing a Li element, a Y element (Y is at least one kind of Nb, B, Al, Si, P, Ti, Zr, Mo, W, and S), and an O element. Also, examples of the nitride solid electrolyte may include $Li_3N$, and examples of the halide solid electrolyte may include LiCl, LiI, and LiBr.

Examples of a binder used in the solid electrolyte layer may include a rubber-based binder such as butyrin rubber (BR) and styrene butadiene rubber (SBR); and a fluoride-based binder such as polyvinylidene fluoride (PVdF).

The thickness of the solid electrolyte layer is, for example, 0.1 μm or more, may be 1 μm or more, and may be 10 μm or more. Meanwhile, the thickness of the solid electrolyte layer is, for example, 300 μm or less, and may be 100 μm or less.

(2) Cathode Active Material Layer

The cathode active material layer is a layer containing a cathode active material, and may further contain at least one of a solid electrolyte, a conductive material, and a binder.

Examples of the cathode active material may include an oxide active material and a sulfur active material. Also, the cathode active material is, for example, preferably capable of reacting with a Li ion. Examples of the oxide active material may include a rock-salt-bed-type active material such as $LiCoO_2$, $LiMnO_2$, $LiNiO_2$, $LiVO_2$, and $LiNi_{1/3}Co_{1/3}Mn_{1/3}O_2$; a spinel type active material such as $LiMn_2O_4$, $Li_4Ti_5O_{12}$, and $Li(Ni_{0.5}Mn_{1.5})O_4$; and an olivine type active material such as $LiFePO_4$, $LiMnPO_4$, $LiNiPO_4$, and $LiCoPO_4$. Also, a coating layer containing a Li ion conductive oxide is preferably formed on the surface of the cathode active material. The reason therefor is to inhibit the reaction of the cathode active material with a solid electrolyte.

Examples of the conductive material used in the cathode active material may include a carbon material such as acetylene black (AB) and Ketjen black (KB). Also, the solid electrolyte and the binder used in the cathode active material are in the same contents as those described in the column of the solid electrolyte described above; thus, the descriptions herein are omitted.

The thickness of the cathode active material layer is, for example, 0.1 μm or more, may be 1 μm or more, and may be 10 μm or more. Meanwhile, the thickness of the cathode active material layer is, for example, 300 μm or less, and may be 100 μm or less. Also, examples of the cathode current collector for collecting current of the cathode active material layer may include a SUS foil and an Al foil.

(3) Anode Active Material Layer

The anode active material layer is a layer containing an anode active material, and may further contain at least one of a solid electrolyte, a conductive material, and a binder.

Examples of the anode active material may include a metal active material and a carbon active material. Also, the anode active material is, for example, preferably capable of reacting with a Li ion. Examples of the metal active material may include a simple substance of metal, a metal alloy, and a metal oxide. The metal element included in the metal active material may include Li, Si, Sn, In, and Al. The metal alloy is preferably an alloy containing the metal element as a main component. Examples of the carbon active material may include mesocarbon microbeads (MCMB), highly oriented pyrolytic graphite (HOPG), hard carbon, and soft carbon.

The solid electrolyte, the conductive material, and the binder used in the anode active material are in the same contents as those described in the column of the solid electrolyte and the cathode active material layer above; thus, the descriptions herein are omitted.

The thickness of the anode active material is, for example, 0.1 μm or more, may be 1 μm or more, and may be 10 μm or more. Meanwhile, the thickness of the cathode active material layer is, for example, 300 μm or less, and may be 100 μm or less. Also, examples of the anode current collector for collecting current of the anode active material layer may include a SUS foil and a Cu foil.

(4) All Solid State Battery

The all solid state battery in the present disclosure is a battery containing the above described inorganic solid electrolyte. Above all, the inorganic solid electrolyte is preferably a sulfide solid electrolyte. The sulfide solid electrolyte is preferably included in at least one of the cathode active material layer, the anode active material layer, and the solid electrolyte layer. Among them, the sulfide solid electrolyte is preferably included in at least the solid electrolyte layer.

B. Method for Producing All Solid State Battery

The method for producing an all solid state battery of the present disclosure comprises a preparing step of preparing an all solid state battery, and a testing step of testing the all solid state battery using the above described testing method.

According to the present disclosure, the all solid state battery is tested using the above described testing method, and thus the all solid state battery with higher safety can be obtained.

1. Preparing Step

The preparing step is a step of preparing an all solid state battery (all solid state battery before the testing step). There are no particular limitations on the method for preparing the all solid state battery; the battery may be fabricated by one own, and may be purchased from others. In the former case, a general method for fabricating an all solid state battery may be adopted.

Figure 3A:
FIGS. 3A to 3F are schematic cross-sectional views illustrating an example of the preparing step in the present disclosure.
Figure 3B:
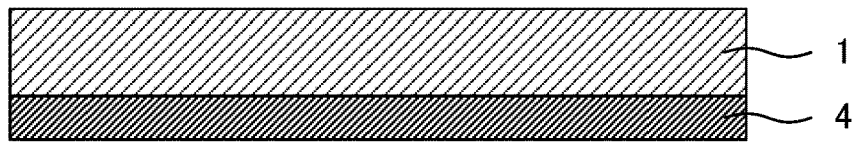
Figure 3C:
Figure 3D:
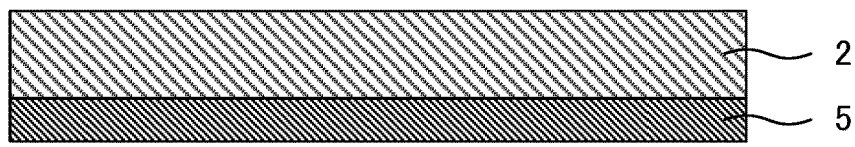
Figure 3E:
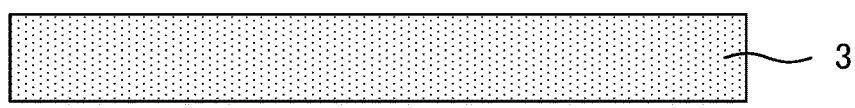
Figure 3F:
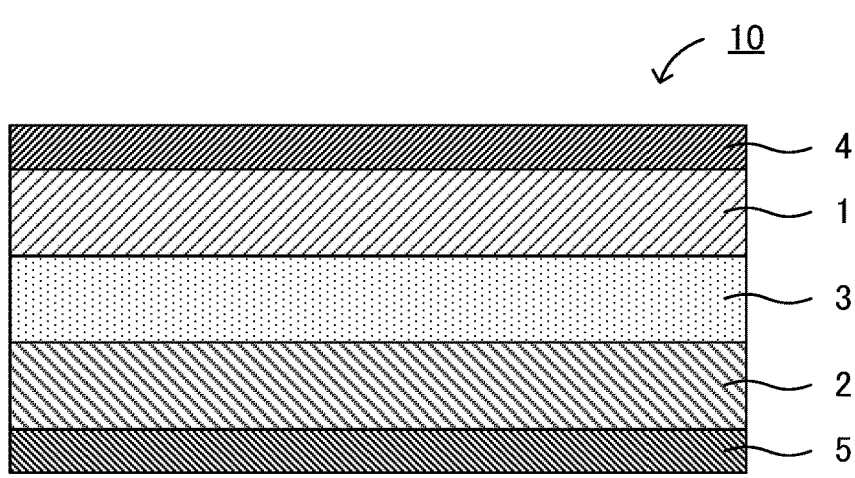

FIGS. 3A to 3F are schematic cross-sectional views illustrating an example of the preparing step in the present disclosure. First, cathode current collector 4 is prepared (FIG. 3A). Next, slurry containing at least a cathode active material is pasted on cathode current collector 4 and dried to obtain a cathode having cathode current collector 4 and cathode active material layer 1 (FIG. 3B). Next, anode current collector 5 is prepared (FIG. 3C). Next, slurry containing at least an anode active material is pasted on anode current collector 5 and dried to obtain an anode having anode current collector 5 and anode active material layer 2 (FIG. 3D). Next, slurry containing at least a solid electrolyte is pasted, dried, and pressed to form solid electrolyte layer 3 (FIG. 3E). Next, one surface of solid electrolyte layer 3 and cathode active material layer 1 of the cathode are arranged so that the both faces to each other. Next, the other surface of solid electrolyte layer and anode active material layer 2 of the anode are arranged so that the both face to each other. After that, the product is pressed and thereby all solid state battery 10 is obtained (FIG. 3F).

2. Testing Step

The testing step is a step of testing the all solid state battery (all solid state battery prepared in the preparing step) using the method described in "A. Method for testing all solid state batter" above. The method for testing is in the same contents as those described above; thus, the descriptions herein are omitted. Also, the all solid state battery judged acceptable in the testing step is usually selected.

C. Method for Producing Battery Pack

The method for producing a battery pack of the present disclosure comprises: a preparing step of preparing an all solid state battery; a testing step of testing the all solid state battery using the above described method for testing an all solid state battery; and an assembling step of assembling a battery pack using a plurality of the all solid state battery judged acceptable in the testing step.

According to the present disclosure, the all solid state battery judged acceptable in the testing step is used and thus a battery pack with higher safety can be obtained. The preparing step and the testing step are in the same contents as those described in "B. Method for producing all solid state battery"; thus, the descriptions herein are omitted. Also, the assembling step is in the same manner as in the assembling step of a general battery pack. The battery pack of the present disclosure may be a battery in which a plurality of the all solid state battery are connected in parallel, and may be a battery in which a plurality of the all solid state battery are connected in series. Also, adjacent all solid state batteries may share current collectors.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

Production Example 1

Fabrication of Cathode

A cathode mixture slurry containing: cobaltate lithium as a cathode active material, $70Li_2S$-$30P_2S_5$ glass ceramic as a solid active material, and polyvinylidene fluoride (PVDF) as a binder, was fabricated. The cathode mixture slurry was pasted on one surface of a SUS foil, which was as a cathode current collector, and dried to obtain a cathode having a cathode active material layer on the cathode current collector (FIGS. 3A and 3B).

Fabrication of Anode

An anode mixture slurry containing: graphite as an anode active material, $70Li_2S$-$30P_2S_5$ glass ceramic as a solid active material, and PVDF as a binder, was fabricated. The anode slurry was pasted onto both surfaces of a SUS foil, which was as an anode current collector, and dried to obtain an anode having the anode active material layer respectively on the both surfaces of the anode current collector (FIGS. 3C and 3D).

Fabrication of Solid Electrolyte Layer

A solid electrolyte mixture slurry containing: $70Li_2S$-$30P_2S_5$ glass ceramic as a solid electrolyte, and butadiene rubber (BR) as a binder, was fabricated. The solid electrolyte mixture slurry was pasted, dried, and pressurized to obtain a solid electrolyte layer (FIG. 3E).

Fabrication of Evaluation Cell

An evaluation cell (without foreign substance) was obtained by arranging the cathode on one surface of the solid electrolyte layer, arranging the anode on the other surface of the solid electrolyte layer, and applying pressure to the product (FIG. 3F). Incidentally, the thickness of the solid electrolyte layer was 30 μm. Incidentally, the voltage of the obtained evaluation cell was approximately 0 V to 0.2 V.

Production Example 2

Figure 4:
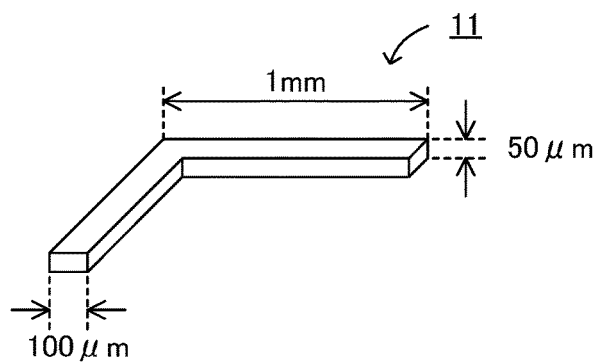
FIG. 4 is a schematic perspective view explaining a foreign substance in the present disclosure.

As illustrated in FIG. 4, SUS304 foreign substance 11 (conductive foreign substance) in L shape was prepared. An evaluation cell (with foreign substance) was obtained in the same manner as in Production Example 1, except that the foreign substance was used. In specific, the foreign substance was arranged in between the solid electrolyte layer and the cathode active material layer at the timing of after the fabrication of the solid electrolyte layer illustrated in FIG. 3E, and before the fabrication of the evaluation cell as illustrated in FIG. 3F. Incidentally, the foreign substance included in the evaluation cell was present in the state not penetrating the solid electrolyte layer.

Example 1

A confining pressure of 10 MPa was applied to the evaluation cell (without foreign substance) obtained in Production Example 1 in the thickness direction. Next, the evaluation cell confined was placed still inside a box made of styrene foam. Next, liquid nitrogen was injected into the box so that the evaluation cell was completely soaked. Incidentally, when the liquid nitrogen decreased, the liquid was injected appropriately in addition. Thereby, the temperature of the evaluation cell was dropped to −190° C., and the cell was frozen. Incidentally, the temperature of the evaluation cell was measured by sticking a T-shaped thermocouple to the surface of the cell.

Resistance Measurement

The resistance between the cathode and anode terminals in the frozen evaluation cell (without foreign substance) was measured using a digital multi meter (34410A from Agilent. The resistance ($\Omega \cdot cm^2$) was determined by the obtained resistance multiplied by the facing are (1000 $cm^2$) of the cathode active material layer and the anode active material layer. As the result, the resistance of the evaluation cell exceeded the limit of the measurement (1.2*$10^{17}$ $\Omega \cdot cm^2$.

Current Measurement

An insulation resistance meter (8340A, ULTRA HIGH RESISTANCE METER from ADCMT) was connected to the cathode and anode terminals of the frozen evaluation cell (without foreign substance), and applied 1000 V thereto to measure the current value $I_1$. As the result, the current value $I_1$ was $9.8*10^{-9}$. Meanwhile, the temperature of the evaluation cell (with foreign substance) obtained in Production Example 2 was dropped to −190° C. in the same manner as above, and the cell was frozen. Likewise, the current value $I_2$ of the frozen evaluation cell (with foreign substance) was measured. As the result, the current value $I_2$ was 6.3 mA. Here, when whether $I_2/I_1 \geq 1.5$ is satisfied is made the criterion for judging the possibility of foreign substance detection, the detection of foreign substance was possible in Example 1.

Incidentally, the relationship of $I_1$ and $I_2$ with the above described $I_A$ and $I_B$ is as follows. $I_B$ is a current value that becomes a reference for judging the acceptability, and is a definite reference determined in accordance with a purpose. On the other hand, $I_A$ is a current value actually measured in the cell targeted for the test. Meanwhile, $I_1$ is a current value actually measured in the evaluation cell (without foreign substance) imitated as a quality product, can be considered as the same meaning as $I_B$ in the sense that the value is almost the same as the reference, and can be considered as the same meaning as $I_A$ in the sense that the value is actually measured. On the other hand, $1_2$ is a current value actually measured in the evaluation cell (with foreign substance) imitated as a defective product, and can be basically considered as the same meaning as $I_A$. Also, as shown in later described Example 10, for example, when the number of times to apply voltage is increased, $I_1$ may increase in some cases. Depending on the amount of increase, $I_1$ cannot be considered as the same meaning as $I_B$ that is the definite reference for judging acceptability. In such a case, $I_2/I_1$ means a relative reference for judging whether a foreign substance can be detected or not. In other words, while $I_A/I_B$ is a reference for judging acceptability of a product, $I_2/I_1$ signifies the reference of judging acceptability of a product in some cases and also signifies as a relative reference for judging whether a foreign substance can be detected or not in some cases. Incidentally, the preferable range of $I_2/I_1$ is the same as the above described preferable range of $I_A/I_B$.

Damage Evaluation

A resistance measurement by charging before freezing was conducted for the evaluation cell (without foreign substance) obtained in Production Example 1. In specific, the cell was charged in the conditions of 25° C., 10 seconds, and 1 A, increased voltage (ΔV) was measured, and the resistance $R_1$ was determined from the relationship of R=ΔV/I. Next, the evaluation cell (without foreign substance) after the current measurement was charged in the same manner as above to determine the resistance $R_2$. Here, when $R_2/R_1 \geq 1.1$, it was evaluated as damaged by applying voltage, and when $R_2/R_1 < 1.1$, it was evaluated as not damaged by applying voltage. The cell was not damaged in Example 1.

Example 2

A current measurement and a damage evaluation were conducted in the same manner as in Example 1 except that the voltage applied was changed to 2 V.

Example 3

A resistance measurement, a current measurement and a damage evaluation were conducted in the same manner as in Example 1 except that the temperature of the evaluation cell during freezing was changed to −140° C.

Examples 4 to 6

A current measurement and a damage evaluation were conducted in the same manner as in Example 3 except that the voltage applied was respectively changed to 200 V, 2 V, and 500 V.

Example 7

A resistance measurement, a current measurement and a damage evaluation were conducted in the same manner as in Example 1 except that the evaluation cell was not confined and the temperature of the evaluation cell during freezing was changed to −135° C.

Example 8

A current measurement and a damage evaluation were conducted in the same manner as in Example 7 except that the voltage applied was changed to 2 V.

Reference Example 1

A resistance measurement, a current measurement and a damage evaluation were conducted in the same manner as in Example 1 except that the temperature of the evaluation cell during freezing was changed to −135° C.

Reference Example 2

A current measurement and a damage evaluation were conducted in the same manner as in Reference Example 1 except that the voltage applied was changed to 2 V.

Reference Example 3

A resistance measurement, a current measurement and a damage evaluation were conducted in the same manner as in Example 1 except that the temperature of the evaluation cell during freezing was changed to −120° C.

Reference Example 4

A current measurement and a damage evaluation were conducted in the same manner as in Reference Example 3 except that the voltage applied was changed to 2 V.

Reference Example 5

A resistance measurement, a current measurement and a damage evaluation were conducted in the same manner as in Reference Example 3 except that the evaluation cell was not confined.

TABLE 1

|  | Example 1 | Example 2 | Example 3 | Example 4 | Example 5 | Example 6 | Example 7 | Example 8 |
|---|---|---|---|---|---|---|---|---|
| Temperature (° C.) | −190 | −190 | −140 | −140 | −140 | −140 | −135 | −135 |
| Confined or not | YES | YES | YES | YES | YES | YES | NO | NO |
| Resistance (Ω·cm²) | $1.2 * 10^{17}$ or more | $1.2 * 10^{17}$ or more | $3.2 * 10^8$ | $3.2 * 10^8$ | $3.2 * 10^8$ | $3.2 * 10^8$ | $3.3 * 10^8$ | $3.3 * 10^8$ |
| Voltage applied (V) | 1000 | 2 | 1000 | 200 | 2 | 500 | 1000 | 2 |
| Currency (mA) Without foreign substance | $9.8 \times 10^{-9}$ | $0.1 \times 10^{-9}$ | 3.2 | 0.65 | 0.0065 | 1.6 | 1.5 | 0.003 |
| Currency (mA) With foreign substance | 6.3 | 0.013 | 6.3 | 1.3 | 0.013 | 3.1 | 3.1 | 0.006 |
| Detection of foreign substance | Possible | Possible | Possible | Possible | Possible | Possible | Possible | Possible |
| Damage of cell | None | None | None | None | None | None | None | None |

TABLE 2

|  | Reference Example 1 | Reference Example 2 | Reference Example 3 | Reference Example 4 | Reference Example 5 |
|---|---|---|---|---|---|
| Temperature (° C.) | −135 | −135 | −120 | −120 | −120 |
| Confined or not | YES | YES | YES | YES | NO |
| Resistance (Ω·cm²) | $9.8 * 10^7$ | $9.8 * 10^7$ | $4.5 * 10^6$ | $4.5 * 10^6$ | $1.3 * 10^7$ |
| Voltage applied (V) | 1000 | 2 | 1000 | 2 | 1000 |
| Currency (mA) Without foreign substance | 9.8 | 0.020 | 210 | 0.42 | 24 |
| Currency (mA) With foreign substance | 10 | 0.021 | 220 | 0.46 | 25 |
| Detection of foreign substance | Not possible | Not possible | Not possible | Not possible | Not possible |
| Damage of cell | Damaged | None | Damaged | None | Damaged |

As shown in Table 1, in Examples 1 to 8, presence of defect causing short circuit was detected with high accuracy by increasing the resistance of the all solid state batteries to be $3.2*10^8$ Ω·cm² or more. On the other hand, as shown in Table 2, in Reference Examples 1 to 5, the presence of defect causing short circuit was not detected with high accuracy since the increase in the resistance of the all solid state battery was small. However, as described above, in the evaluation cells (evaluation cell fabricated in Production Example 2) used in Reference Examples 1 to 5, the foreign substance was present in the state not penetrating the solid electrolyte layer; thus, the difficulty of the detection was high. Accordingly, even with the detection conditions in Reference Examples 1 to 5, for example, if it is a detection of the presence of minute short circuit, the minute short circuit would be detected.

Also, when Examples 1 and 2 are compared to Examples 3 to 6, it was confirmed that the lower the temperature during freezing was, the more the resistance of the all solid state battery increased. Also, meanwhile, the temperature during freezing in Example 7 was higher than that in Example 6; however, the resistance (Ω·cm²) of Example 7 was higher than that of Example 6 since the all solid state battery was not confined. In this manner, the resistance of the all solid state battery was adjusted by not only the temperature during freezing but also by the confining pressure.

Also, when the damage to the evaluation cell was considered, on the occasion of the current measurement for the evaluation cell without a foreign substance (evaluation cell fabricated in Production Example 1), it was suggested that the resistance (Ω·cm²) and the applying voltage were preferably adjusted so that the current value becomes 3.2 mA (Example 3) or less. In other words, it was suggested that, the applying voltage can be increased when the resistance (Ω·cm²) is high enough, but the applying voltage is preferably adjusted to be low when the resistance (Ω·cm²) is comparatively low.

Production Example 3

An evaluation cell (with foreign substance) was obtained in the same manner as in Production Example 2 except that the substance was brought into the state penetrating the solid electrolyte layer. Incidentally, a part of the foreign substance was in point-contact with the cathode active material, and a minute short circuit was caused.

Example 9

A resistance measurement and a current measurement were conducted in the same manner as in Example 1 except that the evaluation cell (with foreign substance) obtained in Production Example 3 was used instead of the evaluation cell (with foreign substance) obtained in Production Example 2, the temperature of the evaluation cell during freezing was changed to −90° C., and the voltage applied was changed to 2 V.

TABLE 3

|  | Example 9 |
|---|---|
| Temperature (° C.) | −90 |
| Confined or not | YES |
| Resistance (Ω·cm²) | $3.2 * 10^5$ |
| Voltage applied (V) | 2 |

TABLE 3-continued

|  |  | Example 9 |
|---|---|---|
| Currency (mA) | Without foreign substance | 5.8 |
|  | With foreign substance | 10 |
| Detection of minute short circuit |  | Possible |

As shown in Table 3, in Example 9, the presence of minute short circuit was detected with high accuracy by increasing the resistance of the all solid state battery.

Example 10

An evaluation cell (without foreign substance) and an evaluation cell (with foreign substance) were obtained in the same manner as in Production Examples 1 and 2 except that an Al foil was used as the cathode current collector, and a Cu foil was used as the anode current collector. A plurality of the obtained evaluation cell (without foreign substance) and the evaluation cell (with foreign substance) were prepared, and the confining pressure of 10 MPa was applied in the thickness direction respectively. After that, the cell was respectively charged so that the battery voltage became in the range of 0 V to 4.0 V. Next, the charged evaluation cells were placed still in a box made of styrene foam. Next, liquid nitrogen was injected into the box so that the evaluation cells were completely soaked. Incidentally, when the liquid nitrogen decreased, the liquid was appropriately injected in addition. Thereby, the temperature of the evaluation cells was dropped to −150° C. and the cell was frozen. Incidentally, the temperature of the evaluation cells was measured by sticking a T-shaped thermocouple to the surface of the cell.

An insulation resistance meter (8340A, ULTRA HIGH RESISTANCE METER from ADCMT) was connected to the cathode and anode terminals of the frozen evaluation cell (without foreign substance), and applied 200 V (for 2 seconds) thereto three times, and the current value $I_1$ at the third time was measured. In the same manner, 200 V (for 2 seconds) was applied to the frozen evaluation cell (with foreign substance) for three times, and the current value $I_2$ at the third time was measured.

Figure 5:
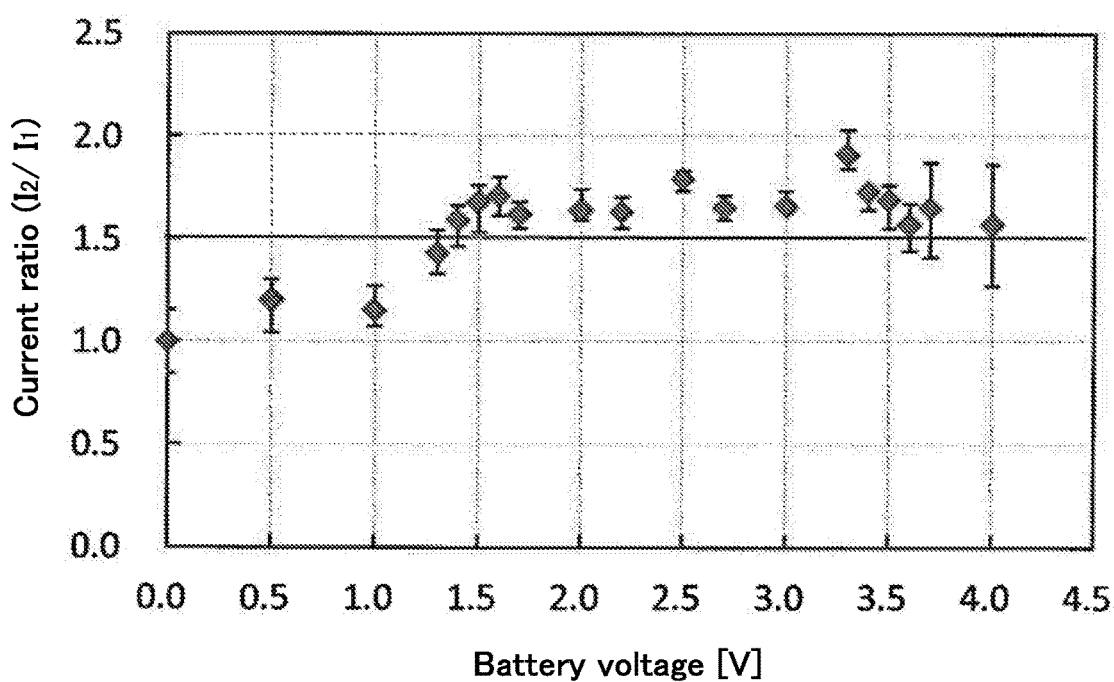
FIG. 5 is a graph showing a relation between a battery voltage and a current ratio $I_2/I_1$.

The relationship of the battery voltage and the current ratio $I_2/I_1$ is shown in FIG. 5. As shown in FIG. 5, when the battery voltage was 1.5 V or more and 3.5 V or less, $I_2/I_1 \geq 1.5$ was satisfied. Incidentally, the down limit 1.5 of $I_2/I_1$ is an example of the reference; it means that the detection of a foreign substance becomes easier as the value of the down limit becomes larger.

On the other hand, when the battery voltage was less than 1.5 V, $I_2/I_1 \geq 1.5$ was not satisfied. $I_2$ was in the same level regardless of the battery voltage, but $I_1$ of when the battery voltage was less than 1.5 V was larger than $I_1$ of when the battery voltage was 1.5 V or more and 3.5 V or less. That is, $I_1$ was increased by applying voltage a plurality of times; as the result, the value of $I_2/I_1$ became small. The reasons therefor may include, when the battery voltage was less than 1.5 V, possibility of deterioration or deformation of the sulfide solid electrolyte, and possibility of generation of a conductive sulfide (such as CuS) by applying voltage at the first time.

Also, when the battery voltage was larger than 3.5 V, $I_2/I_1 \geq 1.5$ was not satisfied. $I_2$ was in the same level regardless of the battery voltage, but $I_1$ of when the battery voltage was more than 1.5 V was larger than $I_1$ of when the battery voltage was 1.5 V or more and 3.5 V or less. That is, $I_1$ was increased by applying voltage a plurality of times; as the result, the value of $I_2/I_1$ became small. The reasons therefor may include, when the battery voltage was more than 3.5 V, possibility of generation of a crack in the solid electrolyte layer due to expansion by charging, possibility that the foreign substance was buried in the crack, and possibility of the occurrence of deterioration of the foreign substance (such as melting) due to high voltage. As the result, the resistance inside the cell decreased to presumably increase $I_1$.

In this manner, it was confirmed that the increase of $I_1$ due to applying voltage was suppressed when the battery voltage was 1.5 V or more and 3.5 V or less. Also, the accuracy for judging acceptability improved since the number of data to be obtained increased.

REFERENCE SIGNS LIST 1 cathode active material layer
2 anode active material layer
3 solid electrolyte layer
4 cathode current collector
5 anode current collector
10 all solid state battery
11 foreign substance

What is claimed is:

1. A method for testing an all solid state battery, the method comprising steps of:
   a resistance increasing step of increasing resistance of an all solid state battery to $3.2*10^5$ Ω·cm2 or more;
   a voltage applying step of applying voltage to an all solid state battery of which the resistance is increased; and
   a judging step of judging acceptability of the all solid state battery based on a current value measured in the voltage applying step.

2. The method for testing an all solid state battery according to claim 1, wherein the resistance of the all solid state battery is increased by a freezing treatment in the resistance increasing step.

3. The method for testing an all solid state battery according to claim 2, wherein the freezing treatment is a treatment of setting a temperature of the all solid state battery to be −90° C. or less.

4. The method for testing an all solid state battery according to claim 2, wherein the freezing treatment is a treatment of setting a temperature of the all solid state battery to be −140° C. or less.

5. A method for testing an all solid state battery, the method comprising steps of:
   a resistance increasing step of increasing resistance of an all solid state battery by a freezing treatment;
   a voltage applying step of applying voltage to an all solid state battery of which resistance is increased; and
   a judging step of judging acceptability of the all solid state battery based on a current value measured in the voltage applying step.

6. The method for testing an all solid state battery according to claim 1, wherein the resistance of the all solid state battery is increased by a treatment of reducing a confining pressure of the all solid state battery in the resistance increasing step.

7. The method for testing an all solid state battery according to claim 1, wherein
the all solid state battery is a battery containing a sulfide solid electrolyte;
the resistance of the all solid state battery of which voltage is adjusted to 1.5 V or more and 3.5 V or less, is increased in the resistance increasing step; and
voltage is applied twice or more in the voltage applying step.

8. A method for testing an all solid state battery, the method comprising steps of:
a preparing step of preparing an all solid state battery; and
a testing step of testing the all solid state battery using the method for testing an all solid state battery according to claim 1.

9. A method for producing a battery pack, the method comprising steps of:
a preparing step of preparing an all solid state battery;
a testing step of testing the all solid state battery using the method for testing an all solid state battery according to claim 1; and
an assembling step of assembling a battery pack using a plurality of the all solid state battery judged acceptable in the testing step.

* * * * *